United States Patent
Zakel et al.

(10) Patent No.: US 9,401,298 B2
(45) Date of Patent: Jul. 26, 2016

(54) METHOD AND DEVICE FOR TRANSFERRING A CHIP TO A CONTACT SUBSTRATE

(75) Inventors: Elke Zakel, Falkensee (DE); Ghassem Azdasht, Berlin (DE)

(73) Assignee: PAC TECH—PACKAGING TECHNOLOGIES GMBH, Nauen (DE)

( * ) Notice: Subject to any disclaimer, the term of this patent is extended or adjusted under 35 U.S.C. 154(b) by 1492 days.

(21) Appl. No.: 11/910,771

(22) PCT Filed: Apr. 10, 2006

(86) PCT No.: PCT/DE2006/000628
§ 371 (c)(1),
(2), (4) Date: Oct. 5, 2007

(87) PCT Pub. No.: WO2006/105782
PCT Pub. Date: Oct. 12, 2006

(65) Prior Publication Data
US 2008/0210368 A1   Sep. 4, 2008

(30) Foreign Application Priority Data

Apr. 8, 2005   (DE) .......................... 10 2005 016 521

(51) Int. Cl.
*H01L 21/683* (2006.01)
*H01L 21/687* (2006.01)
(Continued)

(52) U.S. Cl.
CPC ...... *H01L 21/6835* (2013.01); *H01L 21/67132* (2013.01); *H01L 21/67144* (2013.01); *H01L 21/6836* (2013.01); *H01L 24/31* (2013.01); *H01L 24/75* (2013.01); *H01L 24/86* (2013.01); *H01L 24/83* (2013.01); *H01L 2221/68327* (2013.01); *H01L 2221/68354* (2013.01);
(Continued)

(58) Field of Classification Search
None
See application file for complete search history.

(56) References Cited

U.S. PATENT DOCUMENTS 6,284,086 B1   9/2001   Cardellino et al.
7,210,594 B2   5/2007   Schuetz
(Continued)

FOREIGN PATENT DOCUMENTS

DE   197 49 909 A1   3/2005
EP   1 369 912 A2   12/2003
(Continued)

OTHER PUBLICATIONS

International Search Report corresponding to PCT/DE2006/000628 under date of mailing of Jul. 2, 2007.
(Continued)

*Primary Examiner* — Sonya Mazumdar
(74) *Attorney, Agent, or Firm* — Quarles & Brady LLP

(57) ABSTRACT

A method and device for transferring a chip (18) situated on a transfer substrate (26) to a contact substrate (50), and for contacting the chip with the contact substrate, in which the chip, the back side (19) of which is attached adhesively to a support surface of the transfer substrate facing the contact substrate, is charged with laser energy from behind through the transfer substrate, and the chip contacts (59, 60) thereof that are arranged opposite a contact surface (58) of the contact substrate are brought into contact with substrate contacts (56, 57) arranged on the contact surface by means of a pressing device (45, 46) from behind through the transfer substrate, and a thermal bond is created between the chip contacts and the substrate contacts.

10 Claims, 3 Drawing Sheets

(51) Int. Cl.
*H01L 21/67* (2006.01)
*H01L 23/00* (2006.01)

(52) U.S. Cl.
CPC ....... *H01L2224/16* (2013.01); *H01L 2224/293* (2013.01); *H01L 2224/2929* (2013.01); *H01L 2224/75* (2013.01); *H01L 2224/7565* (2013.01); *H01L 2224/75263* (2013.01); *H01L 2224/75314* (2013.01); *H01L 2224/7965* (2013.01); *H01L 2224/81005* (2013.01); *H01L 2224/81224* (2013.01); *H01L 2224/81801* (2013.01); *H01L 2224/83192* (2013.01); *H01L 2224/83851* (2013.01); *H01L 2924/014* (2013.01); *H01L 2924/01006* (2013.01); *H01L 2924/01033* (2013.01); *H01L 2924/01079* (2013.01); *H01L 2924/01082* (2013.01); *H01L 2924/19043* (2013.01)

(56) References Cited

U.S. PATENT DOCUMENTS

2001/0017403 A1\* 8/2001 Kurosawa et al. ............ 257/651
2004/0142273 A1\* 7/2004 Nishida et al. ................ 430/200
2004/0218336 A1 11/2004 Schuetz
2005/0000634 A1\* 1/2005 Craig et al. ................... 156/230
2005/0155699 A1\* 7/2005 Hayashi et al. ............... 156/230

FOREIGN PATENT DOCUMENTS

| | | |
|---|---|---|
| JP | H02151047 A | 6/1990 |
| JP | H05335377 A | 12/1993 |
| JP | H06262743 A | 9/1994 |
| JP | H11121481 A | 4/1999 |
| JP | 2002026071 A | 1/2002 |
| JP | 2004221184 A | 8/2004 |
| WO | WO 2005/024908 | 3/2005 |

OTHER PUBLICATIONS

English Translation of the First Office Action, Japanese Patent Application No. 2008-504617, Nov. 29, 2011.
Japan Patent Office, Final Office Action, Jp 2008-504617, Jan. 29, 2013.

\* cited by examiner

US 9,401,298 B2

METHOD AND DEVICE FOR TRANSFERRING A CHIP TO A CONTACT SUBSTRATE

CROSS-REFERENCE TO RELATED APPLICATIONS

This application is the National Stage of International Patent Application Number PCT/DE2006/000628 filed 10 Apr. 2006, which claims priority to DE Patent Application 10 2005 016 521.4, filed 8 Apr. 2005, both of which are incorporated by reference herein.

The present invention relates to a method for transferring a chip situated on a transfer substrate to a contact substrate, and for establishing a contact between the chip and the contact substrate, in which the chip, the back side of which is attached adhesively to a support surface of the transfer substrate facing the contact substrate, is charged with laser energy from behind through the transfer substrate, and the chip contacts of the chip that are arranged opposite a contact surface of the contact substrate are brought into contact with substrate contacts arranged on the contact surface from behind through the transfer substrate by means of a pressing device, and a thermal bond is created between the chip contacts and the substrate contacts. The invention further relates to a device for carrying out the method described in the preceding.

Contacting chips on a substrate normally requires manipulation of the chips so as to position the chip opposite the substrate before the actual contacting operation, which is intended to ensure that the relative alignment of the chip contacts opposite the substrate contacts that is essential for successful contacting is guaranteed. This manipulation of individual chips requires correspondingly sophisticated equipment, often in conjunction with further process steps for positioning the individual chips, which in turn entail correspondingly long process times for completing the full contacting procedure.

The object of the present invention is to suggest a method for contacting chips on substrates that may be completed with comparatively low manipulation effort and enables shorter contacting times.

This object is solved with a method and a device disclosed herein.

In the method according to the invention, the chip is not contacted with a substrate by direct manipulation of the chip, but instead by subjecting a transfer substrate to mechanical and thermal loads in such manner that the alignment of the chip, on which a subsequent contacting procedure depends, is defined by the arrangement of the chip on the transfer substrate, and direct manipulation of the chip, with its relatively small dimensions, may be eliminated.

When performing the method according to the invention, it has proven particularly advantageous if the transfer substrate is a foil which, by virtue of the very low thickness common to such foils, forms a carrier as it were for the defined arrangement of the chip, and also presents the lowest possible mechanical and thermal resistance, so that the delivery movement of the chip that is required for contacting may be made with just a small application of pressure, and it is also possible to heat the chip rapidly to create the thermal bond between the chip contacts and the substrate contacts.

By bonding the chip adhesively to the back of the transfer substrate, pressure and heat may be applied to the back of the chip at the same time as the delivery movement is performed to create an initially mechanical contact between the chip contacts and the substrate contacts, and at the same time to dissolve the adhesive bond between the chip and the transfer substrate. At the same time as the adhesive bond is dissolved, indirect thermal loading of the chip enables the chip contacts to be heated, which in turn results in the transfer of heat to the substrate contacts, so that a thermal bond may be created in addition to the mechanically durable, electrically conductive bond between the chip contacts and the substrate contacts.

In order to attach the chip adhesively to the transfer substrate, which has the form of a foil, it is particularly convenient to use an adhesive application, in which case the selection of adhesive material may be adjusted precisely to the desired detachment temperature, that is to say the temperature at which the chip detaches from the foil.

If the adhesive application is realized as an adhesively bonding film that is applied to the foil, it is particularly simple to apply the chip to the foil.

Alternatively, however, it is also possible for an adhesive application to be applied to the chip in order to bond the chip to the transfer substrate.

An adhesive application that is curable with the application of heat and is designed to be electrically conductive in the bonding area between the chip contacts and the substrate contacts may be applied between the chip and the contact substrate to bond the chip to the contact substrate, that is to say for both mechanical and electrical contacting of the chip on the contact substrate. This is true for example of an anisotropic adhesive, in which electrically conductive adhesive particles are aligned in the area of pressure peaks when pressure is applied to them.

Alternatively, it is also possible to bond the chip to the contact substrate by using a soldering substance deposited on the chip contacts and/or the substrate contacts, so that a soldered connection is created to provide a mechanical and an electrical connection between the chip and the contact substrate.

It is also possible to connect the chip and the contact substrate in such manner that for example a soldered connection is created between the chip contacts and the substrate contacts, this soldered connection being intended primarily to assure the electrical contact, and an adhesive application that is curable by heating is provided between the chip and the contact substrate for other purposes in the manner of an underfiller.

The advantages of the method according to the invention become particularly evident when a number of chips disposed on a common foil are transferred to one or more contact substrates and are contacted therewith simultaneously. In this way, it is possible to perform a large number of contacting operations between the chip and contact substrates with a simple delivery movement accompanied by thermal loading, so that the method enables large quantities of component assemblies including a chip and a contact substrate to be produced in a very short time. Such component assemblies include transponders, which include a chip arranged on a substrate, the substrate contacts of which form the ends of an antenna device.

Another particularly advantageous variation of the method according to the invention is possible if the chips are situated on the foil in a wafer arrangement created by separating the chips from a wafer composite. In this way, the chips may be transferred to the transfer substrate in exactly the arrangement that is created by the separation of the chips from a wafer, that is to say by dicing the wafer accordingly.

In order to enable the chips to be transferred to the transfer substrate in the wafer arrangement particularly easily, an adhesive application may be applied to the wafer before it is diced for separating the chips, so that they may be transferred to the transfer substrate as a whole in the wafer arrangement immediately after they are diced, without the need to manipulate the separated chips individually for this purpose.

As an alternative to the 1:1 transfer of a wafer arrangement to the transfer substrate as described above, it may also be advantageous to select an arrangement of the chips on the transfer substrate that matches a contact substrate arrangement, for example when placing several chips on a single contact substrate in the arrangement of the substrate contacts assigned to the respective chips. In such a variation of the method, all of the chips for one contact substrate may be contacted in one contacting operation.

The device according to the invention is particularly suited to the purpose of performing the method according to the invention. The device according to the invention particularly includes a transfer tool, including a laser instrument and a pressing device, thereby enabling not only the delivery movement to be made for creating the mechanical contact, but also the thermal load to be applied for creating the durable mechanical and electrical bond between the chip and the contact substrate.

In a particularly advantageous embodiment, the transfer tool includes a tool member for connecting an optical fiber for transferring laser energy, and a contact tip equipped with a laser transfer device, so that both of the functions described earlier, i.e. both the performance of the delivery movement and the charging with laser energy, are possible with a particularly compact design of the transfer tool.

The advantageous construction of the contact tip as a pressure capillary enables pressure to be applied particularly discretely at the same time as the laser energy is applied directly through the capillary opening.

In order to prevent pressure peaks from occurring if the contact tip comes into contact with the transfer substrate, it is advantageous if a force transfer element that is deformable under a defined load, and particularly spring-supported, is arranged between the tool member and the contact tip.

It is particularly advantageous for transferring and contacting a number of chips if a corresponding number of transfer tools are disposed in one transfer head, so that transferring and contacting may be performed at the same time or in a specified order, according to requirements.

If the transfer tools are also arranged in a matrix pattern in the transfer head, the matrix pattern may be selected particularly advantageously, for example to match a wafer arrangement of chips.

If, as in a further preferred embodiment, the device for arranging the transfer substrate also includes a retaining device for arranging a separating foil as the transfer substrate with several chips in a wafer arrangement, and is equipped with a positioning device for positioning the individual chips of the wafer arrangement to match the arrangement of the chips on the contact substrate, it is possible to distribute the chips in any pattern on the contact substrates during contacting according to a defined wafer arrangement of the chips, and regardless of the design of the contact substrates or the distribution of the chips thereon.

It may also be advantageous if the device for retaining the transfer substrate includes a sheet guidance device for guiding a transfer substrate in the form of a foil sheet, and is equipped with a feed mechanism for positioning the individual chips according to the arrangement of the chips on the contact substrate. In this way, it is possible to select an arrangement of the chips on the transfer substrate, which is in the form of a foil sheet, to match the distribution of the chips on the contact substrate(s), and to carry out contacting of a plurality of chips simultaneously on that basis.

In the following, preferred variations of the method according to the invention and embodiments of devices according to the invention for carrying out the method will be explained in greater detail with reference to the drawing. In the drawing.

Figure 1A:
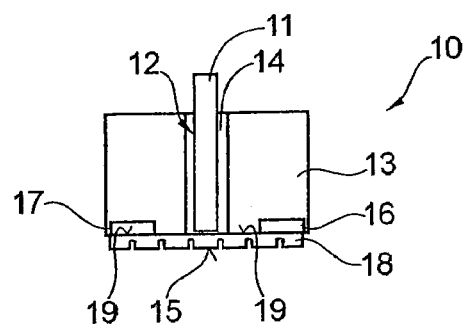
FIGS. 1a and 1b show a basic representation of the principle of the method.
Figure 1B:
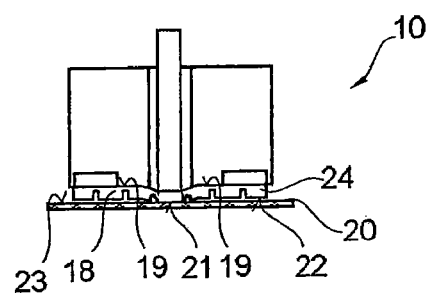

In a highly simplified representation of an embodiment, FIGS. 1a and 1b show a transfer tool 10 including a laser device in the form of an optical fiber 11, which in this case also serves as a pressing device 12. The optical fiber 11 is guided in a channel 14 of a tool member 13. The lower frontal face of tool member 13 is shaped so as to form a contact substrate locating device, 15, on which a foil 17 is retained by vacuum openings 16. The foil 17 is furnished with a plurality of chips 18, which are retained adhesively on the foil 17 by means of an adhesive application—not shown in detail here—formed between a back side 19 of chips 18 and the foil 17.

FIG. 1b shows transfer tool 10 positioned directly above a contact substrate 20 in a transfer configuration, in which the chip 18 located opposite a free contact end 21 of the optical fiber 11 is pressed against the contact substrate 20 to bridge a contact gap 24 formed between a contact surface 22 of the chip 18 and a contact surface 23 of the contact substrate 20. The optical fiber 11, which also serves as a pressing device 12 in this embodiment, is advanced against the back side 19 of chip 18 for this purpose.

Preferably simultaneously with the delivery movement described above, but at all events no later than when the contact surface 22 of the chip 18 is lying flush against the contact surface 23 of the contact substrate 20, the back side of the chip 18 is charged with laser energy through the foil 17, which is transparent to allow the laser energy to pass, with the result that the chip 18 is heated up. The effect of this heating is to reduce the adhesive forces that are affective in the adhesive layer between the back side 19 of the chip 18 and the foil 17, and to activate the adhesive forces of a bonding material that is curable when heated and is arranged between the contact surfaces 22 and 23. This produces a durable mechanical bond between the chip 18 and the contact substrate 20, while at the same time releasing the bond between the foil 17 and the back side 19 of the chip 18.

Figure 2:
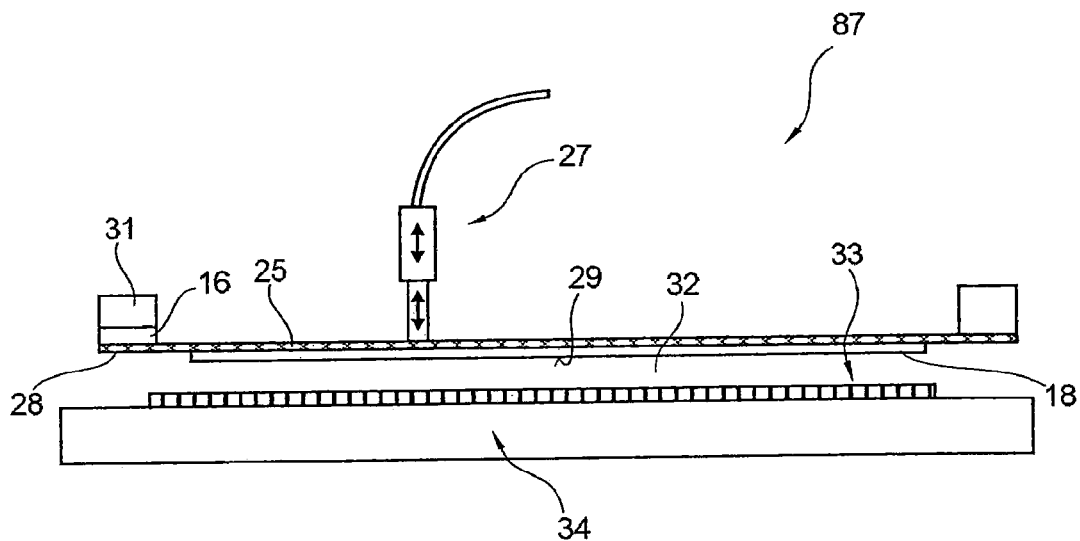
FIG. 2 shows a variation of the method relating to the performance of the method based on a transfer substrate constructed as a "dicing foil"
Figure 3:
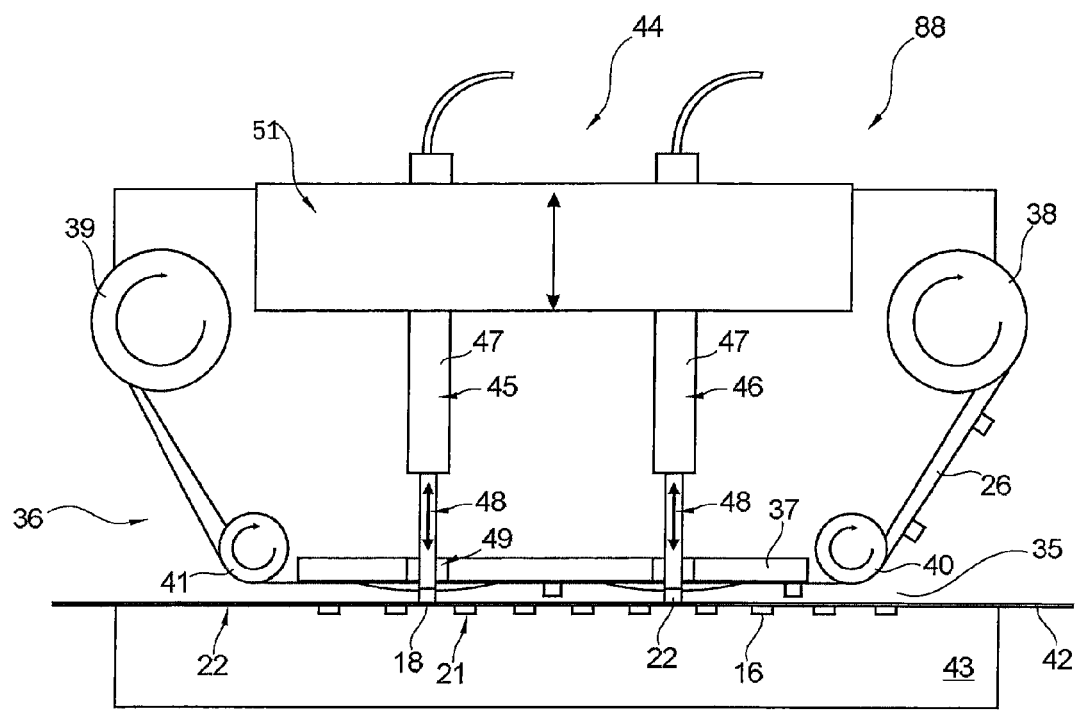
FIG. 3 shows a variation of the method for carrying out the method based on a transfer substrate in the form of a sheet foil.

FIGS. 2 and 3 show two possible method variations and devices that may be implemented therefor, wherein FIG. 2 shows a method variation that is based on a separating foil 25 formed from a "dicing foil" and serving as the transfer substrate, and which is carried out with a first transfer device 87, and FIG. 3 shows a method variation in which the method is based on a foil sheet 26 serving as the transfer substrate, and which is carried out with a second transfer device 88.

For the sake of simplicity, FIG. 2 shows only one transfer tool, which charges the separating foil 25 from behind. On the front side 28 of the separating foil 25, a plurality of chips 18 are situated in a so-called wafer arrangement 29, that is to say the chips 18 are arranged relative to each other exactly corresponding to the arrangement resulting from a separation process for producing individual chips 18 from a wafer. In this case, a carrier frame 31 extending peripherally serves as a means for retaining the separating foil 25, and is furnished with vacuum openings 16 at defined intervals that enable the foil 25 to be retained in the position shown in FIG. 2.

A contact substrate 33, disposed on a contact substrate retaining device 34, is located below the chips 18 that are in wafer arrangement 29 on the separating foil 25, and is separated therefrom by a contact gap 32.

Unlike the design shown in FIG. 2, the transfer device 88 shown in FIG. 3 does not have the form of a separating foil 25, but of a foil sheet 26 which is advanced past a foil sheet bearing device 37 by a sheet guidance device 36. Chips 18 may be arranged on the foil sheet 26 so that an adhesive application is applied to the entire surface of the wafer before separation. After separation, the chips 18, which are in the wafer arrangement 29, may then be transferred to the foil sheet 26 by means of the adhesive application on the back side 19 thereof. For transporting the foil sheet 26, the sheet guidance device 36 is equipped with a foil sheet take-off reel 38, a foil sheet take-up reel 39, and two diverter pulleys 40, 41, which enable the foil sheet 26 to be guided parallel to the foil sheet bearing device 37. The foil sheet bearing device 37 is furnished with a number of vacuum openings—not shown in detail here—which enable the foil sheet 26 to be adjusted to create a defined contact gap 35 between the foil sheet 26 and a contact substrate sheet 42, which is advanced via a contact substrate sheet bearing device 43. The contact substrate sheet bearing device 43 is also furnished with a number of vacuum openings 16, which serve to bring the contact substrate sheet 42 to bear in defined manner against the contact substrate sheet bearing device 43.

A transfer head 44 is located above the foil sheet bearing device 37 and includes a plurality of transfer tools 45, 46, which are disposed in a compound arrangement by means of a cross beam 51, in which tool housings 47 of the transfer tools 45, 46 are retained in defined manner, to form the transfer head 44. A linearly guided delivery element 48 is included in each tool member 47 of the transfer tools 45, 46, and each of these elements advances into delivery recesses 49 in the foil sheet bearing device 37.

Figure 4:
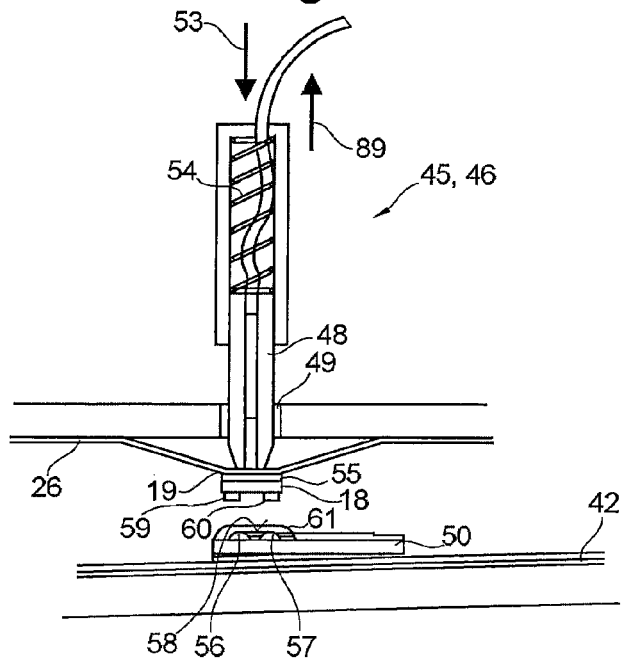
FIG. 4 shows an enlarged representation of the operations for carrying out the method directly in the transfer area of a chip.

In the transfer configuration of the transfer device 88 as shown in FIG. 3, a delivery movement by the cross beam 51 causes the delivery elements 48 in both transfer tools 45, 46 to penetrate the delivery recesses 49, thus pressing chips 18, which are adhesively attached to the foil sheet 26, against contact substrates 50—not further shown in FIG. 3—that are arranged on the contact substrate sheet 42 (FIG. 4). As is indicated by the double-headed arrow in FIG. 3, all transfer tools 45, 46 on the transfer head 44 may be caused to perform a delivery movement simultaneously via corresponding loading of the cross beam 51. If the foil sheet 26 and the contact substrate sheet 42 are timed to move at a corresponding speed along the foil sheet bearing device 37 and the contact substrate sheet bearing device 43 respectively, it is possible to produce individually desired overlaps between the chips 18 and the contact substrates 50 disposed on the contact substrate sheet 42 beneath them, and separated by the contact gap 35, as is shown in the enlarged partial view according to FIG. 4.

FIG. 4 shows a transfer tool 45, 46 as it performs a delivery movement towards a contact substrate 50 located on the contact substrate sheet 42. As is indicated by the arrow 53, the delivery movement is caused by the movement of the tool member 47 of the transfer tool 45, 46. The linearly movable delivery element 48, which is guided in the tool member 47, is braced against the tool member 47 via a spring mechanism 54 that is disposed in the tool member 47. As a result, at the moment of contact between the chip 18, the back side 19 of which is bonded adhesively to the foil sheet 26 by an adhesive film 55, the delivery element 48 is able to spring back in an avoidance movement, thereby preventing damage. In the embodiment shown in FIG. 4, the area of the contact surface 58 of the contact substrate 50 with two substrate contacts 56, 57 is coated with an anisotropic adhesive material 61, in which conductive contact bridges are formed in the area of pressure peaks as a result of the contacting operation between chip contacts 59, 60 and the substrate contacts 56, 57. The adhesive material 61 hardens as a result of thermal load that is applied to the chip contacts 59, 60 at the same time as the contacting operation, and permanently fixes the contact bridges described in the aforegoing. By this time if not before, the adhesive bond formed by the adhesive layer 55 between the back side 19 of the chip 18 and the foil sheet 26 has been dissolved, with the result that after the transfer tool 45, 46 has effected a return movement in the direction of the arrow 89, the contacting between the chip 18 and the contact substrate 50 is retained, and the foil sheet 26 and the contact substrate sheet 42 are able to advance so that a subsequent transfer and contacting operation may be performed.

Figure 5:
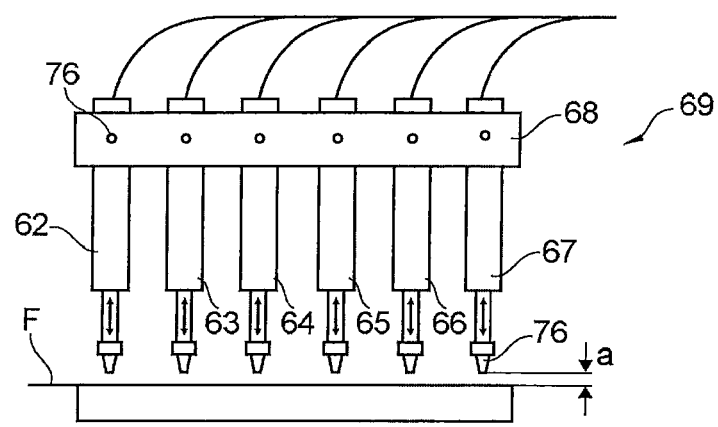
FIG. 5 shows a plurality of transfer tools arranged in rows.

FIG. 5 shows several transfer tools 62 to 67, which are combined in a row arrangement 69 by a common cross beam 68. The construction and function of the individual transfer tools 62 to 67 are the same as for the transfer tools 45, 46 described previously with reference to FIGS. 3 and 4.

Figure 6:
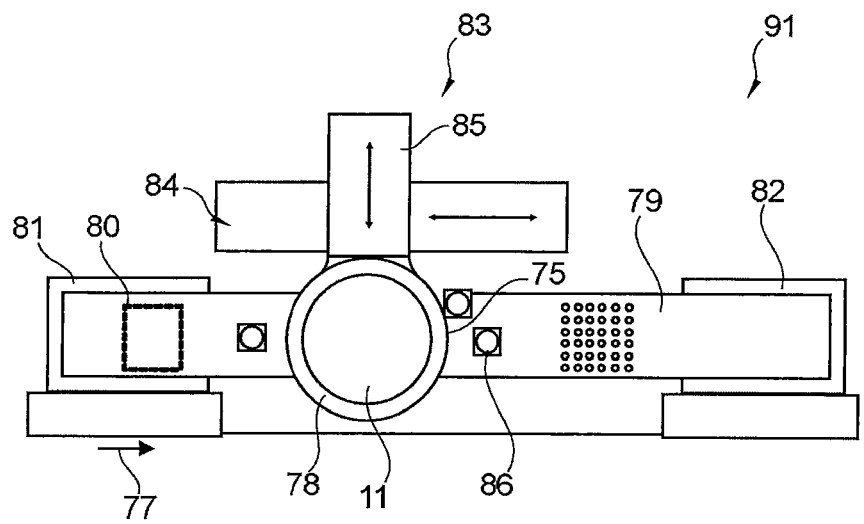
FIG. 6 shows the performance of the method based on a transfer substrate in the form of a "dicing foil" with a schematic top view of a transfer head.

In the embodiment of FIG. 5, a total of six transfer tools 62 to 67 are combined in a row arrangement 69. Of course, it is also possible to combine different numbers of transfer tools in a row arrangement, and to combine the row arrangement with other row arrangements 70 to 74, to create a matrix pattern 75 (FIG. 6). In the embodiment of FIG. 5, adjusting mechanisms 76 are provided to adjust the relative alignment of individual transfer tools 62 to 67 in the row arrangement 69 relative to each other, and these enable the longitudinal axes of the transfer tools 62 to 67 to be aligned relative to each other, and uniform height adjustment of the transfer tools 62 to 67 to create a consistent distance a between a contact tip 92 of the transfer tools 62 to 67 and a reference surface F.

As was seen previously in FIG. 2, the separating foil 25 in the embodiment shown in FIG. 6 is a "dicing foil". This means that the separating foil 25 is the same foil as is used to produce a plurality of individual chips by dicing a wafer. In this context, in the related art the wafer is arranged on a foil, the "dicing foil" so that the separation operation may proceed, in other words so that the wafer may be manipulated for the dicing operation. After dicing has been carried out, the individual chips are left in a "wafer arrangement" on the dicing foil. With the transfer device 91 shown in FIG. 6, this dicing foil or separating foil serves as the transfer substrate for carrying out the method.

As is shown in FIG. 6, a transfer head 78 is used to simultaneously transfer the plurality of chips in a wafer arrangement, and this transfer head is only indicated by a schematic representation of the individual optical fibers 11 that are allocated to the transfer tools disposed in row arrangements 69 to 74.

Below the separating foil 25 with the chips in wafer arrangement disposed on the back side thereof—not shown in FIG. 6—there is a contact substrate sheet 79 on which contact substrate arrangements 80 are disposed with a plurality of contact substrates—not shown in detail—the arrangement of whose substrate contacts may or may not match the arrangement of chip contacts as defined by the wafer arrangement of the chips. The contact substrate arrangements 80 may be moved under the wafer arrangement on the separating foil 25 by means of suitable transport devices 81, 82, by advancing the contact substrate sheet 79 in the feed direction 77. In the case that the substrate contact arrangement matches that of the chip contacts, the entire wafer arrangement of chips may be transferred to the contact substrates of the contact substrate arrangement 80 in a single transfer and contacting operation, similar to that shown in FIG. 4. If the pattern of the contact substrates in the contact substrate arrangement does not match that of the chip contacts of the chips disposed in the wafer arrangement, the chips may also be transferred and contacted individually or in groups, in which case the chips may be moved to an the appropriate position relative to the contact substrates by means of a corresponding control device 83 with axes of movement 84 and 85. The control device 83 may be actuated via camera devices 86 in combination with an image processing device.

As was described with reference to FIG. 4, a thermally activated adhesive application may also be provided between the chip and the contact substrate in the embodiment shown in FIG. 6 for contacting between the chips and the contact substrates. In this context, it has also proven advantageous if the material used for the adhesive material contains activated carbon fibers to enable conductivity. Alternatively, soldered contacting may be performed, wherein for example a solder material may be applied to the chip contacts and/or the contact substrate contacts. The chip contacts may also be provided with a contact metallization consisting of an electrolessly deposited nickel-gold coating.

The invention claimed is:

1. A method for transferring a chip situated on a transfer foil to a contact substrate, and for establishing contact between the chip and the contact substrate, in which the chip, the back side of which is attached adhesively to a support surface of the transfer foil facing the contact substrate, is charged with laser energy from behind through the transfer foil, and the chip contacts thereof that are arranged opposite a contact surface of the contact substrate are brought into contact with substrate contacts arranged on the contact surface by means of a pressing device from behind through the transfer foil thereby the pressing device deflecting the transfer foil, the contacting of the chip contacts with the substrate contacts being carried out by deflecting the transfer foil, and a thermal bond is created between the chip contacts and the substrate contacts while the foil being in the deflected state.

2. The method according to claim 1, in which in order to secure the chip adhesively on the transfer substrate, the foil is provided with an adhesive application at least in the contact area with the back side of the chip.

3. The method according to claim 2, in which the foil is provided with an adhesive application film.

4. The method according to claim 1, in which an adhesive application arranged between the chip and the contact substrate is used to bond the chip to the contact substrate.

5. The method according to claim 1, in which a solder material application disposed on the chip contacts and/or the substrate contacts is used to bond the chip to the contact substrate.

6. The method according to claim 1, in which a plurality of chips arranged on a common foil is transferred to the contact substrate and contacted therewith at the same time.

7. The method according to claim 6, in which the chips are arranged on the foil in a wafer arrangement created by separating the chips from a wafer composite.

8. The method according to claim 7, in which the foil on which a wafer is arranged during separation of the chips from the wafer composite is used as the foil.

9. The method according to claim 6, in which the chips are arranged on the foil in a transfer arrangement that matches a contact substrate arrangement of the chips on the contact substrate.

10. A method for transferring a chip situated on a transfer foil to a contact substrate, and for establishing contact between the chip and the contact substrate, in which a the back side of the chip is attached adhesively to a support surface of the transfer foil facing the contact substrate, said method comprising:

charging the chip having chip contacts with laser energy from behind through the transfer foil;

arranging the chip contacts opposite a contact surface of the contact substrate;

bringing the chip contacts into contact with substrate contacts arranged on the contact surface by means of a pressing device deflecting the transfer foil from behind the transfer foil; and thermally bonding the chip contacts and the substrate contacts while the foil is deflected by the pressing device.

\* \* \* \* \*